United States Patent

Bailey

[11] Patent Number: 5,709,962
[45] Date of Patent: Jan. 20, 1998

[54] CELL TESTER DEVICE EMPLOYING SPACED APART ELECTROCHROMIC ELECTRODES

[75] Inventor: John C. Bailey, Columbia Station, Ohio

[73] Assignee: Eveready Battery Company, Inc., St. Louis, Mo.

[21] Appl. No.: 396,505

[22] Filed: Nov. 8, 1994

Related U.S. Application Data

[63] Continuation-in-part of Ser. No. 246,926, May 20, 1994, Pat. No. 5,458,992, which is a continuation of Ser. No. 648,080, Jan. 31, 1991, abandoned.

[51] Int. Cl.⁶ .................................................. H01M 10/48
[52] U.S. Cl. ............................................ 429/93; 324/435
[58] Field of Search .................... 429/92, 93; 324/435

[56] References Cited

U.S. PATENT DOCUMENTS

| | | | |
|---|---|---|---|
| 4,680,527 | 7/1987 | Benenati et al. | 320/2 |
| 4,702,563 | 10/1987 | Parker | 350/351 |
| 4,702,564 | 10/1987 | Parker | 350/351 |
| 4,737,020 | 4/1988 | Parker | 350/351 |
| 4,835,475 | 5/1989 | Hanakura et al. | 324/435 |
| 5,015,544 | 5/1991 | Burroughs et al. | 429/93 |
| 5,059,895 | 10/1991 | Cataldi et al. | 324/104 |
| 5,156,931 | 10/1992 | Burroughs et al. | 429/93 |
| 5,196,144 | 3/1993 | Smith et al. | 252/500 |
| 5,223,003 | 6/1993 | Tucholski et al. | 29/623.4 |
| 5,332,530 | 7/1994 | Eid et al. | 252/583 |
| 5,339,024 | 8/1994 | Kuo et al. | 324/435 |
| 5,458,992 | 10/1995 | Bailey | 429/93 |

FOREIGN PATENT DOCUMENTS

| | | | |
|---|---|---|---|
| 60-66170 | 4/1985 | Japan | 429/93 |

*Primary Examiner*—Stephen Kalafut
*Attorney, Agent, or Firm*—Robert W. Welsh

[57] ABSTRACT

A tester label for electrochemical cells employing two spaced apart electrically conductive electrochromic electrodes in which an ionically conductive electrolyte is disposed on the electrodes and in the space between the electrodes to produce a two-layer tester for batteries so that when the electrodes are applied to a power source, the electrochromic electrodes will undergo a chemical reaction and exhibit a change of color thereby producing a color contrast between them.

21 Claims, 3 Drawing Sheets

CELL TESTER DEVICE EMPLOYING SPACED APART ELECTROCHROMIC ELECTRODES

This application is a continuation in part of U.S. Ser. No. 246,926, filed on May 20, 1994, now U.S. Pat. NO. 5,458, 992 issued Oct. 17, 1995, which is a continuation of patent application Ser. No. 648,080 filed Jan. 31, 1991, and now abandoned.

FIELD OF THE INVENTION

The invention relates to a tester device for electrochemical cells which comprises a first electrically conductive electrochromic electrode spaced apart from a second electrically conductive electrochromic electrode and an ionically conductive electrolyte disposed in the space between the electrodes and at least partially over the electrodes so that when the electrodes are connected to a power source, the electrochromic electrodes will undergo a chemical reaction and exhibit a change of color that will provide a visual contrast between the electrodes.

BACKGROUND OF THE INVENTION

Batteries are generally stored for various periods of time before being put into use. The batteries can be stored by the seller and frequently when purchased they are again stored by the buyer prior to being put to use. It is therefore desired to have some sort of testing means for determining if a battery has sufficient charge to operate a desired device. Initially, separate battery testers were developed which could measure the strength remaining in the battery. Recently battery testers have been developed that either are included in the battery package or assembled in the label secured to the battery. The testers generally indicate the capacity remaining in the battery.

U.S. Pat. No. 4,702,564 discloses a device for testing a battery, particularly a small, portable battery, comprising a flexible, transparent substrate on which is deposited a narrow band of a black light absorbing material. A conductive material, which may taper outwardly in opposite directions from a central point to a pair of terminals, is then deposited atop the substrate on the same side of the substrate as the absorber layer or on the opposite side of the substrate as the absorber layer. A layer of a cholesteric liquid crystal material is then deposited on the substrate on the opposite side from the black absorber layer or over the absorber layer. The conductive material is an epoxy cement-based conductor, preferably silver, printed or painted directly on the substrate. An indicator scale is located along sections of the conductive material. To test a dry cell battery, the terminal ends of the conductive material are placed in contact with the battery terminals, causing a current to flow which heats the conductive material, the heat generated being the most intense at the central point and radiating outwardly. The heat is transferred through the thin substrate to the liquid crystal layer which results in a color change in the liquid crystal. The traverse of the color change along the length of the indicator scale, outwardly from the center point, is proportional to the current or voltage output or the condition of the battery to be tested and can be read on the indicator scale which is calibrated accordingly. The tester also includes means for determining the amp-hours or life of a battery.

U.S. Pat. No. 5,015,544 discloses a battery strength indicating and switch means on a battery which is coupled across the terminals of the battery and which is provided with an indicating means to indicate the strength of the battery and in addition, the battery strength indicating means is also provided with an in-line switch which can easily be depressed to complete the circuit so as to place the indicator means across the terminals of the cell and display the charge of the battery.

U.S. Pat. No. 5,059,895 discloses a battery voltmeter comprising:

(A) a dielectric layer;
(B) a conductive layer above or below one of the surfaces of the dielectric layer; and
(C) a temperature sensitive color indicator layer in thermal contact with the conductive layer, characterized in that the conductive layer has (1) thermal insulating means under one of its surfaces and (ii) sufficient heat generating capacity to affect a change in the temperature sensitive color indicator layer. The voltmeter can be integrated into a label, and attached directly to a battery.

U.S. Pat. No. 4,835,475 discloses an apparatus for indicating the electromotive force of a dry battery which comprises:

(i) a film base;
(ii) an electrically conductive layer disposed on one side of the film base,
(iii) a protective layer disposed on the electrically conductive layer, and
(iv) a thermochromic layer disposed on the other side of the film base.

U.S. Pat. No. 4,442,187 discloses batteries having conjugated polymer electrodes in which the conjugated polymers are doped with ionic dopant species to a preselected room temperature electrical conductivity ranging from that characteristic of semiconductor behavior to that characteristic of metallic behavior, by means of reversible electrochemical doping procedures. The electrochemical doping reactions and their reverse electrochemical undoping reactions are utilized as the charging and discharging mechanisms of lightweight secondary batteries which employ doped or dopable conjugated polymer as one or both of their electrodes.

U.S. Pat. No. 4,940,640 discloses polyaniline electrodes in which the oxidation and hydrogenation levels of the polyaniline species of the electrodes are carefully controlled. Electrochemical cells employing these electrodes function by reversible oxidation and reduction of the polyaniline species forming the electrode.

U.S. Pat. No. 5,232,631 discloses solutions and plasticized compositions of electrically conductive substituted and unsubstituted polyanilines in nonpolar organic fluid phases with functionalized protonic acids and the use of such compositions for various applications such as conductive articles.

European Patent Application 497616-A2 discloses a tester for use in determining the voltage and state-of-charge of a battery. The tester can be permanently mounted on the battery and employs an electrochromic cell which changes visual appearance, for example, color or intensity of color when electrically connected across the terminals of a battery. The electrochromic cell undergoes an oxidation/reduction reaction on direct application of the DC potential of the battery. The color of the electrochromic cell can be compared with a color comparison chart to determine the condition of the battery. The tester can be permanently electrically connected to the battery or, preferably, can be connected momentarily to determine the state of the battery.

An object of the present invention is to provide a cell tester device employing two spaced apart electrically conductive electrochromic electrodes, and an ionically conductive electrolyte disposed between said electrodes and at least partially on top of said electrodes to provide a two-layer cell tester device.

Another object of this present invention is to provide a cell tester device that utilizes only two layers, thus making it cost effective to produce and suitable for efficient automatic assembly.

These and other objects will be apparent from the following description.

SUMMARY OF THE INVENTION

The invention relates to a cell tester device for an electrochemical cell having a first terminal and a second terminal of opposite polarity; a substrate; a first electrically conductive electrochromic electrode disposed on said substrate; a second electrically conductive electrochromic electrode disposed on said substrate and spaced from said first electrochromic electrode; an ionically conductive electrolyte extended over at least a portion of each electrode; said first electrochromic electrode adapted to electrically contact the first terminal of the cell; and said second electrochromic electrode adapted to electrically contact the second terminal of the cell so that when the first electrode makes electrical contact with the first terminal and the second electrode makes electrical contact with the second terminal, both electrodes will undergo a chemical reaction to exhibit a visible contrasting color change. Preferably, the ionically conductive electrolyte could also be disposed in the space between the electrodes.

In another aspect, this invention is a process for manufacturing a tester device for an electrochemical cell. The tester has the construction defined above and is made by depositing the electrodes first onto the substrate and then depositing the ionically conductive electrolyte between the electrodes and onto at least a portion of the electrodes. In this embodiment the electrolyte need not be transparent or translucent. This approach is particularly useful with a transparent or translucent substrate, such as a plastic film, through which the electrochromic electrodes can be viewed. If desired, the ionically conductive electrolyte could be deposited first on the substrate and then the electrodes could be deposited over the ionically conductive electrolyte. In the latter embodiment, if a transparent or translucent plastic is used as the substrate, it is preferred that the ionically conductive electrolyte be at least translucent so that the visible change in the electrodes could be viewed through the substrate. Preferably the ionically conductive electrolyte would be transparent and, if a proton conductor is required, can be selected from materials such as poly-2-acrylamido-2-methyl propanesulfonic acid [poly(AMPS)], polystyrene sulfonic acid, gelled organic acids and gelled aqueous acids such as HCl, HC$_2$SO$_4$ and the like.

As used herein, the term "electrochromic electrode" shall mean an electrode made of an electrically conductive electrochromic material, an electrode made of a substantially homogeneous mixture of an electrochromic material and a conductive material, or an electrode made of a conductive matrix having an electrochromic material dispersed throughout the matrix. Preferably, the electrically conductive electrochromic working electrode should be formed from an electrically conductive electrochromic material.

The cell testing device is provided for detecting and measuring the state-of-charge of a cell or battery. The test device employs electrochromic electrodes that change color (change in light absorption) as the electrodes change oxidation state, a redox-type reaction, under the influence of a DC potential applied from the battery directly to the electrochromic electrodes. The electrochromic electrodes are preferably a solid.

In the preferred embodiment of the invention, the tester is incorporated into a label for a battery. In this embodiment, the tester is comprised of a working electrode and a counter electrode, both of which are made of an electrically conductive electrochromic material and arranged side-by-side (in the same plane) with a narrow space or gap (e.g., about 0.005 inch) between them. A thin layer of ionically conductive electrolyte material is overlaid on these electrodes, covering the space or gap and a substantial portion of the surface of the two electrodes. These electrode and electrolyte layers are preferably applied by printing techniques to the interior side of a transparent outer plastic film which ultimately covers the finished, labeled battery.

Preferably, the electrochromic material to be used in the cell tester device of this invention can be either an organic or an inorganic material which changes color or color intensity, that is, optical absorption, on application of a DC potential. The electrochromic electrode undergoes an oxidation/reduction reaction, commonly referred to as a redox reaction, in order to develop or change color. The optical absorptivity of the electrochromic electrode is controlled by driving the electrochromic electrode from one state to another with an external power source.

In some cases, the electrochromic material itself may not undergo the redox reaction but may react with a redox product to produce a color change. An example of such a system is the production of OH$^-$ electrochemically followed by the reaction of the OH$^-$ with an organic pH indicating dye to give a color change. This type of electrochromic system is the subject of U.S. Pat. No. 3,280,701 by J. F. Donnelly and R. C. Cooper.

Electrochromic materials which show a very large change in extinction coefficient are preferred so that very little electrode material (and hence a very small amount of current) is required to produce a visible color change. Suitable inorganic electrochromic materials for use in this invention are represented by WO$_3$, MoO$_3$, TiO$_2$, SnO$_2$, Cr$_2$O$_3$, NiO$_2$, MnO$_2$, Mn$_2$O$_3$ and Prussian blue which are typical of many well-known solid inorganic electrochromic materials. Such materials have been studied extensively in applications such as optical filters, one-way glass (smart windows), and variable reflectance mirrors. These materials can be used in a solid form as a coating applied to the translucent or transparent plastic or as an ink solution where it can be printed on the translucent or transparent plastic.

Representative of suitable solid organic electrochromic materials include many macrocyclic and polycyclic materials such as substituted phthalocyanines, polypyrroles and polyanilines and common dyes and redox indicators such as naphthol blue black and N,N'-diphenylbenzidine. These materials can be applied in solid form as a film on the substrate, e.g. a translucent or transparent plastic. The preferred electrochromic materials would be substituted and unsubstituted phthalocyanines, polyanilines, polypyrroles, and polythiophenes which are electrically conductive and therefore could be used as the sole material for the electrodes. These polymers have conjugated unsaturation in their backbone chain and preferably have an electronic conductivity of at least 10$^{-5}$-S/cm or greater. The preferred electrochromic material is polyaniline which could be printed on a plastic substrate. Suitable polyanilines are disclosed in U.S. Pat. Nos. 4,940,640 and 5,232,631. The polyaniline can be doped with electrolyte salts or chemically substituted to increase its electronic conductivity. A dispersion of fine particles could be used, but a solution is preferred to obtain more uniform thin films.

An example of a solid organic material that can be polymerized electrochemically to produce a conductive electrochromic film is N-benzylaniline.

When the electrochromic material is not sufficiently electrically conductive for use as an electrode, the conductivity can be enhanced by mixing the electrochromic material with a conductive powder or depositing the electrochromic material on a conductive substrate. Examples of suitable conductive materials include metals such as nickel and metal oxides such as indium-tin oxide. Electrochromic materials that are substantially non-conductive can be placed in a matrix of electrically conductive particles, e.g., a sintered matrix of metal powder, so that the overall matrix is conductive and the substantially non-conductive electrochromic material is in contact with the conductive matrix of particles. Preferably, transparent conductive powders should be used, such as indium-tin oxide, along with an electrochromic material such as Prussian blue, tungsten trioxide, nickel oxide and the like. In another embodiment, the electrochromic material may be deposited on the surface of optically transparent conductive powders by a chemical, electrochemical, precipitation, vapor or other suitable means. Although the use of a transparent conductive powder is preferred, it is possible to use a non-transparent conductive material; however, the visual effect of the electrochromic transition is limited to the surface of the electrode in this embodiment.

Ionically conductive electrolyte materials suitable for use in the electrochromic cell testing label may be inorganic or organic, liquid or solid, or combinations thereof, e.g., polymer electrolyte materials such as poly-2-acrylamido-2-methyl propanesulfonic acid [poly(AMPS)], polystyrenesulfonic acid, or polymers containing effective amounts of aqueous or nonaqueous electrolytes so as to form an ionically conductive gel, e.g., polyethylene oxide containing an aqueous solution of HCl or $H_2SO_4$ or an electrolyte salt. The electrolyte should have sufficient ionic conductivity to operate the cell testing label. It is preferred that the electrolyte be a polymer or gel electrolyte which can be applied by a high speed printing or coating process and contain a pigment such as titanium dioxide to provide a white contrast, substituted titanium dioxides to produce various shades of yellow, and other inorganic or organic pigments. Preferably, the contrast agent is not conductive and is used only in the electrolyte.

Preferably, the two working electrodes and electrolyte could be printed or painted on the plastic sheet in the appropriate order. The thickness of the two working electrodes could vary from 1 to 250 microns, preferably from 2 to 100 microns and most preferably from 10 to 30 microns. Preferably, the thickness of the electrolyte should be from 1 to 250 microns, more preferably from 2 to 100 microns and most preferably from 10 to 30 microns. The total two-layer testing cell could vary in thickness from 2 to 500 microns, and preferably from 4 to 200 microns. The gap or space between the spaced apart electrodes should be from 5 to 1250 microns, preferably from 10 to 500 microns and most preferably from 50 to 200 microns.

Suitable translucent or transparent plastic films are polyesters, polyvinyl chloride (PVC), polyethylene, polyvinylidene chloride and polycarbonates with PVC being the preferred material.

DETAILED DESCRIPTION OF THE PREFERRED EMBODIMENTS

Figures 1, 2, 3:
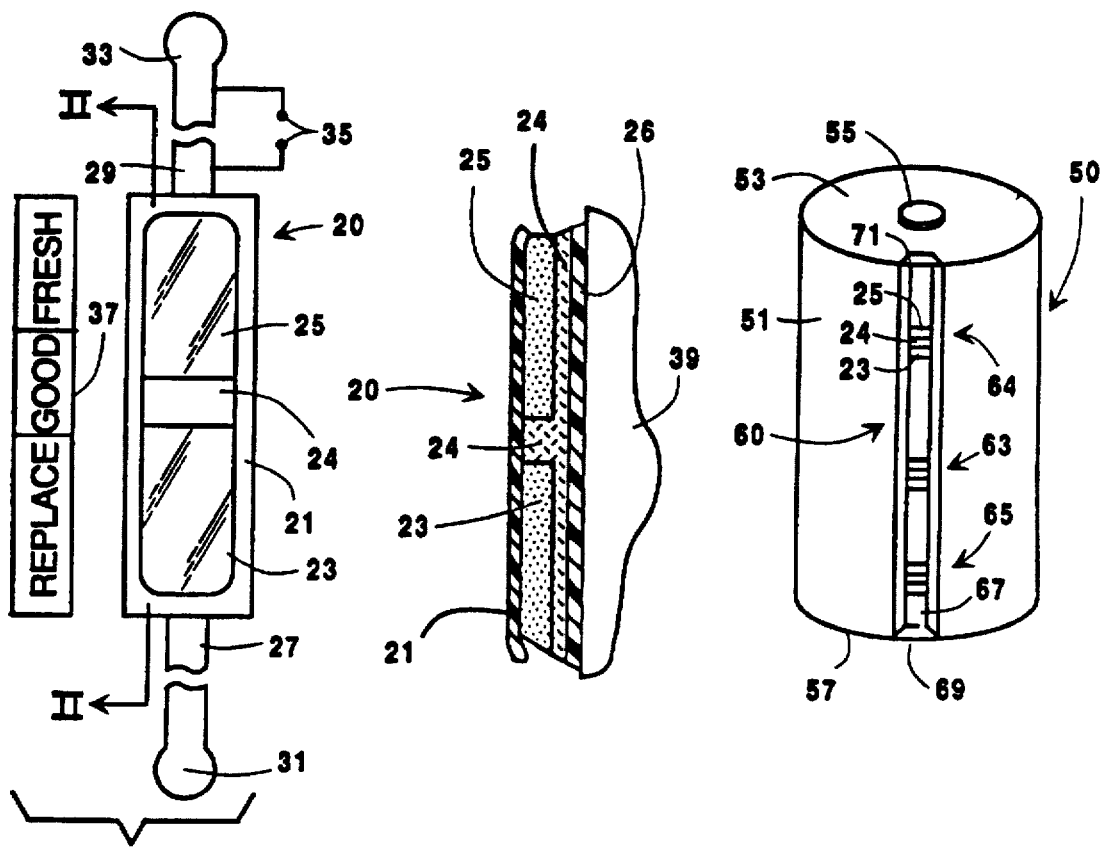
FIG. 1 is a schematic elevational view of the cell tester device of the present invention.
FIG. 2 is a sectional view taken along the line II—II of FIG. 1.
FIG. 3 is a perspective view of a battery having the cell tester label mounted on a housing.

Referring to FIG. 1, a typical electrochromic cell tester device of this invention is shown and indicated generally by the number 20 and having an indicator strip 37. The device has a transparent or translucent cover 21 for containing the two layers of the cell tester. The translucent or transparent plastic layer 21 is placed over electrochromic electrode 25 and spaced apart electrochromic electrode 23 so that they can be viewed. Electrolyte 24 is arranged between and over a substantial portion of the electrochromic electrodes 23 and 25. Electrical conductors 27 and 29 extend from each end of the cell tester 20 in which conductor 27 is shown as being of indeterminate length and has a terminal 31 for connection to an external terminal of a battery with its opposite end connected to one of the electrodes of cell tester 20. Likewise, the conductor 29 is shown of indeterminate length and has a terminal 33 for connection to the opposite terminal of the battery to be measured and its opposite end is connected to the other electrode of cell tester 20. A switch is schematically illustrated at 35 which can be used to connect the cell tester 20 across the terminals of a battery being tested.

In FIG. 2, the cell tester 20 is shown mounted on a battery 39, only a portion of which is shown. In the example shown here, the cell tester 20 comprises a transparent or translucent plastic 21, an electrochromic electrode 25, an ionically conducting electrolyte layer 24, and a second electrochromic electrode 23 which are enclosed as shown by plastic sheet 21 and the cell tester 20 is placed on nonconductive sheet 26. The electrochromic electrodes can be made of the same material or can be different materials. The requirement is that one electrode be oxidized and the other electrode be reduced when the tester is activated. The electrochromic electrodes can be printed or coated on the transparent plastic sheet 21. If desired, the electrochromic electrodes and electrolyte layer can be printed on the plastic sheet in reverse order, i.e., the electrolyte layer printed first and then the electrochromic electrodes. In the latter version (not shown in FIG. 2), the electrolyte layer would preferably be transparent for viewing the electrochromic electrodes.

The electrochromic materials forming the electrodes can be standard pH or redox materials, e.g., phenolphthalein, methyl violet, ethyl red, methylene blue, N,N'-diphenylbenzidine, naphthol blue black or N,N-dimethylindoaniline. Further examples of such electrochemichromic systems can be found in U.S. Pat. No. 4,902,108 issued Feb. 20, 1990, to Harlan J. Byker, which is incorporated herein by reference. These include N,N,N',N'-tetramethyl-1,4-phenylenediamine; 5,10-dihydro-5,10-dimethylphenazine and N,N', N"-trimethyltriphenazinoxazine Phenolphthalein, methyl violet or ethyl red provide an indicative color change through the oxidation and reduction of the solvent (e.g., $H_2O$). As described above, the electrochromic material may not itself undergo a redox reaction but instead reacts with another species, e.g., protons from water, which are produced by the redox reaction. The electrochemichromic solution can also be thickened by using polymeric thickeners such as polymethyl-methacrylate, polyethylene oxide, poly-2-acrylamido-2-methyl propanesulfonic acid [poly(AMPS)] or the like.

Referring to FIG. 3, a typical C or D size dry cell battery is shown and indicated generally by the number 50. A typical battery has a cylindrical housing 51 and an end cover 53 in contact with positive terminal 55. The opposite end cover is indicated by 57. On the side of housing 51 is an electrochromic cell tester device 60. The cell tester device can have one or more electrochromic cells, for example three cells, similar to cell 20 of FIG. 1, but made with different electrochromic materials poised at different potentials and adapted to be activated at different cell voltages. Cell 64 can be poised to indicate a fresh battery. Cell 63 can be of a similar construction, but poised to indicate a good condition of the battery, while cell 65 is again of similar construction but is poised to indicate that the battery should be replaced. Cell 65 is connected to the negative end cover 57 by means of a conductive strip of material 67 which is folded under and has a contact 69. At the opposite end of the cell label device, a conductor 71 completes the connection to the positive terminal of the battery. Alternative means of making contact between the electrochromic label tester cell or cells and the battery terminals may be used.

As shown in FIG. 3, the label cell tester is continuously in contact with the negative and positive external terminals of the battery. When used in such applications, it is preferred to use a solid state electrochromic cell, the layers of which are applied as coatings over or printed on the inner surface of the transparent plastic sheet 21 shown in FIG. 1. Solid state electrochromic cells tend to draw substantially less current and hence are preferred. If materials draining higher currents are used, it is preferred to use a suitable switch such as switch 35 (FIG. 1) to momentarily connect the cell tester label across the terminals of the battery and, after the reading is complete, the switch should be opened to electrically isolate the battery from the cell tester label.

Figures 4, 5, 6:
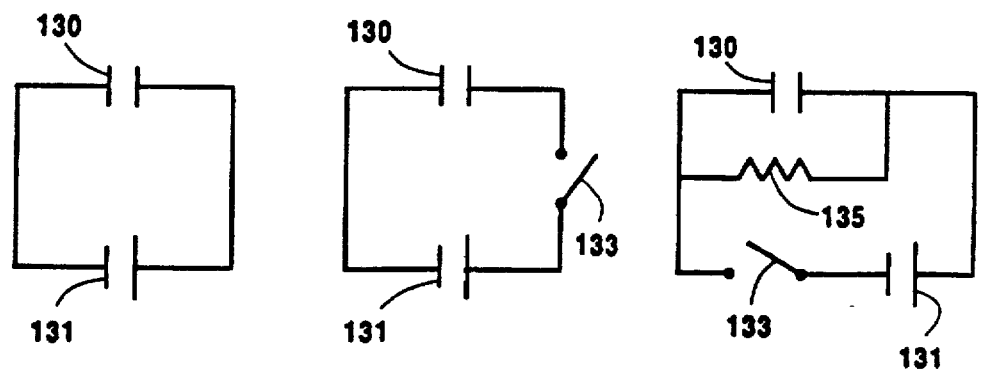
FIG. 4 is a simplified schematic of the electrochromic cell connected for an open circuit test of a battery.
FIG. 5 shows the simplified schematic of FIG. 4 with a switch added to isolate the cell tester label device from the cell.
FIG. 6 is a simplified schematic of a closed circuit cell tester label device.

As indicated above, the battery state indicating device can be in continuous electrical contact with the external terminals of the battery. Since the cell tester label does draw current, it is preferred to have some type of an external switch to isolate it from the battery. The cell tester label can be used in either an open circuit or a closed circuit mode. In the closed circuit mode the voltage of the battery is tested under load. FIGS. 4 and 5 show a typical open circuit configuration for testing a battery. In FIG. 4, electrochromic cell 130 is connected to battery 131 to be tested. In FIG. 5, electrochromic cell 130 is again connected to battery 131; however, in this circuit a switch 133 is used to take the electrochromic cell out of the circuit so as not to discharge the battery. It can be seen in the open circuit test that no load other than the electrochromic cell itself is placed across the terminals of the battery being tested.

Referring to FIG. 6, this figure represents a typical closed circuit test in which a load resistor 135 is place across the electrochromic cell 130. The battery 131 is again connected for testing or isolated by a switch 133. In the open circuit measurement circuit, as shown in FIGS. 4 and 5, the electrochromic cell should be poised to sense the range of voltage produced by the battery 131. When a different voltage range is produced by different types of batteries, different electrochromic electrodes can be used in the electrochromic cell. In the circuit of FIG. 6, the load resistor 135 can be varied to match the potential of the electrochromic cell 130 to the potential produced by the battery 131 in addition to selection of the appropriate electrochromic electrodes. The load resistor 135 can be formed using an electrochromic electrode having intermediate resistivity. Such an electrochromic electrode can be shaped or patterned to vary the resistance and serve as the load along which the potential decreases.

Figure 7:
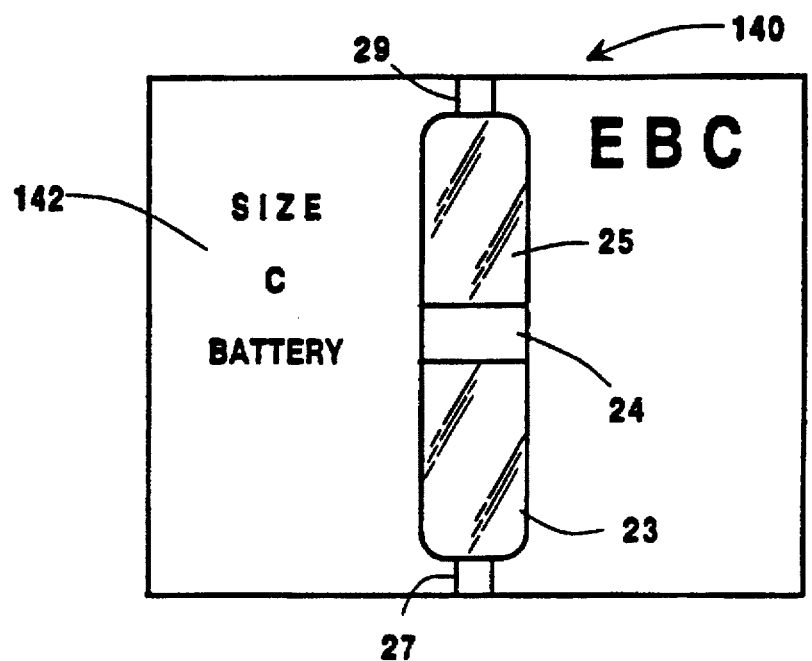
FIG. 7 is a partial elevational view of a label for a battery including a printed cell testing label of this invention.
Figure 8:
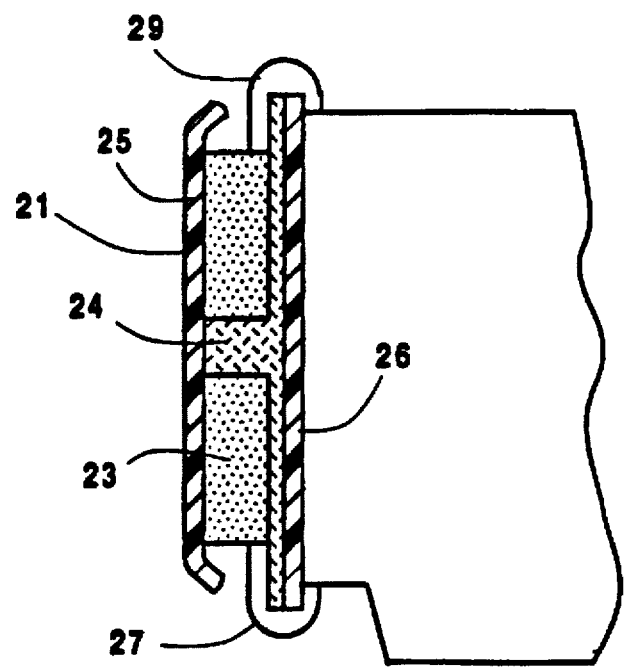
FIG. 8 is a partial sectional view showing the cell tester label of FIG. 7 applied to a battery.

FIGS. 7 and 8 show the two components of the cell tester applied to the label and indicated generally by 140 and using the same reference numbers for the same components shown in FIG. 1. During the label printing process appropriate graphics 142 can be applied to the label. One or more components of the cell tester can be provided by various means such as by printing. The tester device can be prepared so that one electrode of a tester is in electrical contact with one external terminal of the battery and the other electrode is in electrical contact with the opposite terminal of the battery. Either electrical conductor 27 or 29, or both, can be printed as part of the label so that it terminates near one external terminal of the battery without making electrical contact. The open circuit can then be closed by bringing that electrical conductor on the label which is near one terminal of the cell into contact with that terminal to activate the tester. If desired, one conductor can be printed so that it will make electrical contact with a terminal of the battery when the finished label is applied to the cell.

The use of at least one switch is desired, preferably two switches, to reduce the chances of inadvertent activation of the tester. If desired, one of these end contacts could be made permanent by crimping the label edge over into intimate contact with that portion of the cell container. Another switch can be provided on the side of the cell, if desired, or on the opposite end of the cell.

Figure 9:
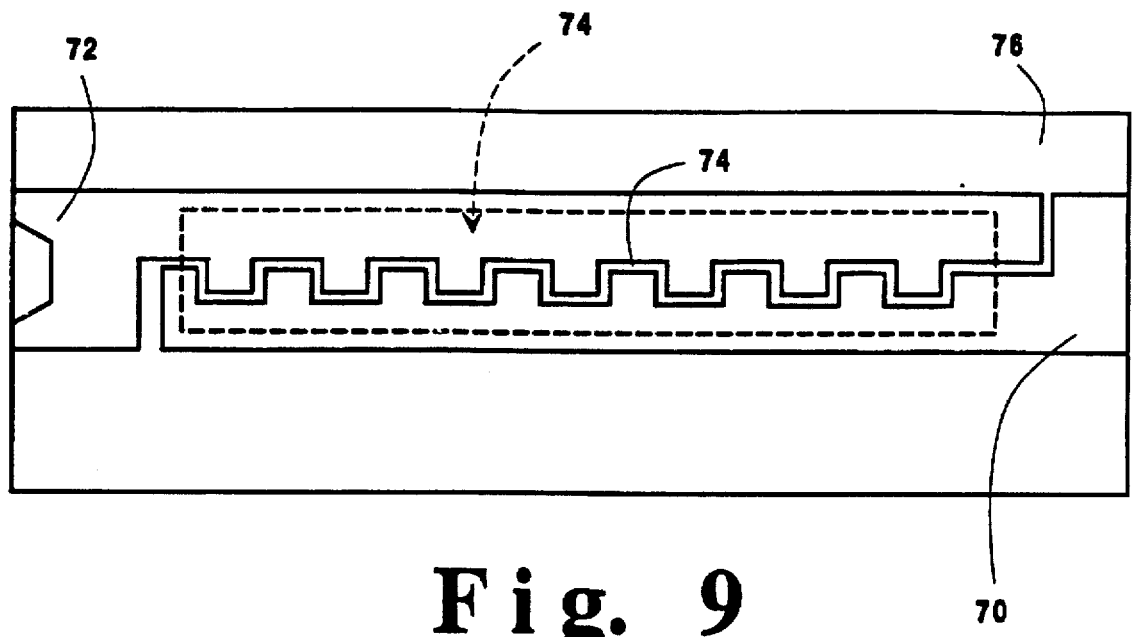
FIG. 9 is an elevational view of another embodiment of the cell tester device of this invention.

FIG. 9 shows an enlarged view of electrochromic electrodes 70 and 72 with ionic electrolyte 74. Electrodes 70 and 72 are printed on plastic sheet 76. One electrode 70 extends to contact one terminal of a cell while the other electrode will extend to contact the opposite terminal of the cell. Although not shown, the electrode 70 and/or 72 could be connected to a terminal of the cell using an elongated straight or curved conductive strip that could be printed on the plastic film. The long conductive strip would provide a selected resistance so that the current flow to the electrodes could be regulated. In the embodiment of the electrodes shown in FIG. 10, the elongated resistive strip could preferably connect electrode 84 to the terminal of the cell that is not connected to electrode 82. Preferably, the elongated strip could be silver or copper printed on the plastic film.

When the switch or switches (not shown) are closed, one electrode material 70 becomes oxidized and the other reduced. For example, the normally green color of the polyaniline electrode then changes to yellow (reduced) or blue (oxidized), the extent of the color change and the vivid nature of the color depending on the state-of-charge of the cell, i.e., the voltage applied to the two electrodes. The interface of the two electrodes may be lengthened by an interdigitated design, as shown in FIG. 9, to show a distinct pattern of the contrasting colors and thereby enhance the visibility of the color change.

Figure 10:
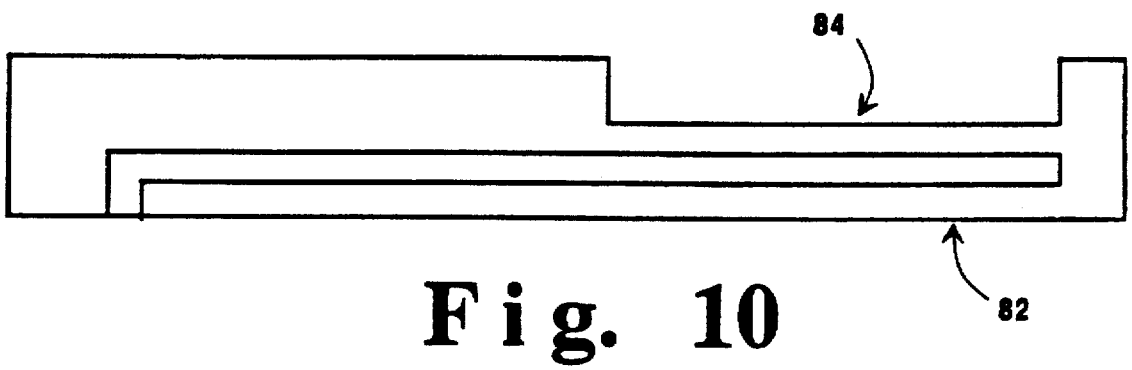
FIG. 10 is a side elevational view of another embodiment of an electrode arrangement of this invention.
Figure 11:
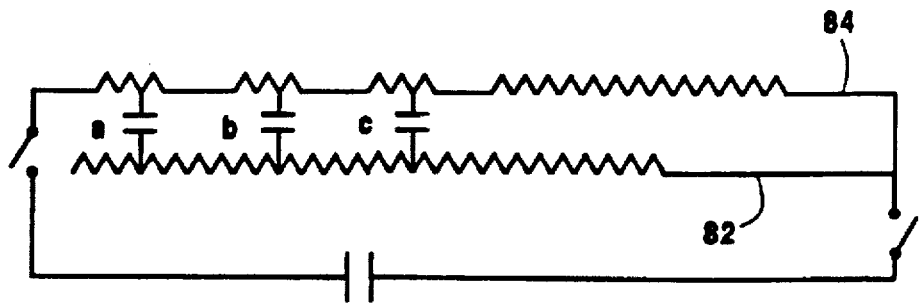
FIG. 11 is a schematic of the electrode arrangement shown in FIG. 10 connected by switch means to a cell to be tested.

Another modification of the electrode arrangement is shown in FIG. 10 where both electrodes 82 and 84 are unitary at one end and adapted to be in electrical contact with the same battery terminal. A portion of one electrode 82 is narrowed (or could be tapered) at some distance near that end to increase the resistance in that area. The color change on activation then varies from one end of the electrode to the other. If effect, this assembly on activation creates a scale along the electrode length. The electrical circuit representing this assembly is shown in FIG. 11 as consisting of a network of resistances. The resistances of electrodes 82 and 84 of FIG. 10 are the resistances shown in FIG. 11. A portion of the cell voltage can be read at various points along the resistances (electrodes), e.g., at points a, b, and/or c, which represent elements of the electrochromic display. Portions of the resistances of electrodes 82 and 84 form a voltage divider network and determine the fraction of the cell potential applied to the display elements at points a, b, and/or c.

In the manufacture of the label tester, it is preferred to use a web of the substrate material which can hold many labels and run the web through suitable printing operations or coating operations where the graphics for each label can be applied to the web along with each layer of the tester. After the label tester has been applied, the web of material can be run through a suitable punch or die cutting operation to separate the individual labels from the web so that the labels can be applied to batteries in the finishing of the battery during the heat shrinking of the label.

From the above description it can be seen that a cell testing label could be provided for testing the state of a battery which can be applied to the housing of the battery and left in place at all times. Since the device does not rely on heat, the thermal mass of the battery will not affect the operation of the device. When the electrical circuit for the testing device is completed, the electrochromic electrode will change color indicating the state of the cell.

Though the invention has been described with respect to a specific preferred embodiment thereof, many variations and modifications will become apparent to those skilled in the art. It is therefore the intention that the appended claims be interpreted as broadly as possible in view of the prior art to include all such variations and modifications.

I claim:

1. A cell tester device for an electrochemical cell having a first terminal and a second terminal of opposite polarity; a substrate; a first electrically conductive electrochromic electrode disposed on said substrate; a second electrically conductive electrochromic electrode disposed on said substrate and spaced from said first electrochromic electrode; an ionically conductive electrolyte extended in contrast with at least a portion of each electrode; said first electrochromic electrode adapted to electrically contact the first terminal of the cell; and said second electrochromic electrode adapted to electrically contact the second terminal of the cell so that when the first electrode makes electrical contact with the first terminal and the second electrode makes electrical contact with the second terminal, both electrodes will undergo a chemical reaction to exhibit a visible contrasting color change.

2. The cell tester of claim 1 wherein at least one electrode comprises a electrically conductive electrochromic material.

3. The cell tester of claim 1 wherein at least one electrode comprises an electrochromic material mixed with a electrically conductive material.

4. The cell tester of claim 1 wherein at least one electrode comprises an electrically conductive matrix containing an electrochromic material dispersed homogeneously throughout and in contact with said matrix.

5. The cell tester of claim 1 wherein the electrodes are made with the same material.

6. The cell tester of claim 1 wherein at least one of said electrochromic electrodes comprises at least one inorganic electrochromic material.

7. The cell tester of claim 6 wherein the inorganic electrochromic material is selected from the group consisting of $WO_3$, $MoO_3$, $TiO_2$, $SnO_2$, $Cr_2O_3$, $NiO_2$, $MnO_2$, $MnO_4$, and Prussian blue.

8. The cell tester of claim 1 wherein at least one of said electrochromic electrodes comprises at least one organic electrochromic material selected from the group consisting of macrocyclic and polycyclic materials.

9. The cell tester of claim 8 wherein the organic electrochromic material is selected from the group consisting of substituted and unsubstituted phthalocyanines, polypyrroles, polyanilines, and polythiophenes.

10. The cell tester of claim 1 wherein the ionically conductive electrolyte is disposed between the electrodes and the substrate is a plastic film that is at least translucent so that the visible change in the electrodes can be seen through the plastic film.

11. The cell tester of claim 1 wherein the electrodes are deposited on the substrate so that one side makes contact with the substrate and the ionically conductive electrolyte is deposited at least over a portion of the opposite side of the electrodes.

12. The cell tester of claim 1 wherein the ionically conductive electrolyte comprises a material selected from the group consisting of inorganic and organic materials.

13. The cell tester of claim 12 wherein the ionically conductive electrolyte material is selected from the group consisting of poly-2-acrylamido-2-methyl propanesulfonic acid, polystyrenesulfonic acid, and polymers containing aqueous or non-aqueous electrolytes.

14. The cell tester of claim 13 wherein the electrochromic electrodes comprise at least one organic electrochromic material selected from the group consisting of substituted and unsubstituted phthalocyanines, polypyrroles, polyanilines, and polythiophenes.

15. The cell tester of claim 1 wherein the first electrode is from 1 to 250 microns thick, the second electrode is from 1 to 250 microns thick, the ionically conductive electrolyte is from 1 to 250 microns thick and the space between electrodes is from 5 to 1250 microns.

16. The cell tester of claim 15 wherein the electrochromic electrodes are polyaniline, and the ionically conductive electrolyte is poly-2-acrylamido-2-methyl propanesulfonic acid [poly(AMPS)].

17. The cell tester of claim 15 wherein the electrochromic electrodes are polypyrrole, and the ionically conductive electrolyte is poly-2-acrylamido-2-methyl propanesulfonic acid [poly(AMPS)].

18. The cell tester of claim 1 wherein the electrochromic electrodes are printed on the substrate and the ionically conductive electrolyte is printed on at least a portion of the electrochromic electrodes and in the space between the electrodes.

19. The cell tester of claim 18 wherein each of the electrochromic electrodes are from 1 to 250 microns thick, the ionically conductive electrolyte is from 1 to 250 microns thick, and the spacing between electrodes is from 5 to 1250 microns.

20. The cell tester of claim 19 wherein the electrochromic electrodes comprise polyaniline.

21. The cell tester of claim 13 wherein said electrolyte material is polyethylene oxide containing an aqueous solution of HCl or $H_2SO_4$.

* * * * *